(12) United States Patent
Zhou et al.

(10) Patent No.: US 7,170,725 B1
(45) Date of Patent: Jan. 30, 2007

(54) MAGNETIC SENSOR HAVING AN ALUMINUM-NITRIDE SEED LAYER FOR AN ANTI-FERROMAGNETIC LAYER

(75) Inventors: Min Zhou, Fremont, CA (US); Chang-Man Park, Mountain View, CA (US)

(73) Assignee: Western Digital (Fremont), Inc., Fremont, CA (US)

( * ) Notice: Subject to any disclaimer, the term of this patent is extended or adjusted under 35 U.S.C. 154(b) by 364 days.

(21) Appl. No.: 10/932,671

(22) Filed: Sep. 1, 2004

(51) Int. Cl.
*G11B 5/39* (2006.01)

(52) U.S. Cl. ............................................. 360/324.11
(58) Field of Classification Search ................ None
See application file for complete search history.

(56) References Cited

U.S. PATENT DOCUMENTS

| | | | |
|---|---|---|---|
| 6,129,957 A * | 10/2000 | Xiao et al. ................ | 427/548 |
| 6,278,592 B1 | 8/2001 | Xue et al. | |
| 6,545,848 B1 * | 4/2003 | Terunuma .............. | 360/324.12 |
| 6,560,078 B1 | 5/2003 | Pinarbasi | |
| 6,636,393 B1 * | 10/2003 | Araki et al. .......... | 360/324.11 |
| 6,819,532 B2 * | 11/2004 | Kamijo ................. | 360/324.11 |

OTHER PUBLICATIONS

Maesaka, Akihiro, et al., "Transmission electron microscopy analysis of crystallographic transition from fcc to fct on PtMn spin valves," Journal of Applied Physics, vol. 88, No. 7, Oct. 1, 2000, pp. 3982-3987.
Li, Haohua, et al., "Exchange enhancement and thermal anneal in Mn76Ir24 bottom-pinned spin valves," Journal of Applied Physics, vol. 89, No. 11, Jun. 1, 2001; pp. 6904-6906.
Pakala, M., et al., "Effect of underlayer roughness, grain size, and crystal texture on exchange coupled IrMn/CoFe thin films," Journal of Applied Physics, vol. 87, No. 9, May 1, 2000, pp. 6653-6655.
Cho, Ho, et al., "Thermal stability of spin-valves incorporating amorphous CoNbZr under and capping layers," Journal of Applied Physics, vol. 91, No. 10, May 15, 2002, pp. 8581-8583.

* cited by examiner

Primary Examiner—Robert S. Tupper
(74) Attorney, Agent, or Firm—Joshua C. Harrison, Esq.

(57) ABSTRACT

A magnetic sensor is disclosed that is disposed between top and bottom magnetic shield layers, the sensor comprising: a nonferromagnetic layer disposed beneath the top shield layer; a magnetically soft layer disposed beneath the nonferromagnetic layer, the magnetically soft layer having a magnetization that rotates in response to an applied magnetic field; a ferromagnetic pinned layer disposed beneath the magnetically soft layer; an antiferromagnetic layer disposed beneath the ferromagnetic layer; and an aluminum-nitride seed layer disposed between the antiferromagnetic layer and the bottom shield layer. The aluminum-nitride seed layer decreases sense current shunting, increases pinning strength, increases magnetoresistance and/or increases yield.

26 Claims, 3 Drawing Sheets

MAGNETIC SENSOR HAVING AN ALUMINUM-NITRIDE SEED LAYER FOR AN ANTI-FERROMAGNETIC LAYER

TECHNICAL FIELD

The present invention relates generally to magnetic sensors for disk drives or other information storage devices. More particularly, the invention relates to seed layers used in magnetic sensors that have both free and pinned magnetic layers.

BACKGROUND

The employment of magnetoresistive (MR) sensors for reading signals from media is well known. Such sensors read signals from the media by detecting a change in resistance of the sensor due to magnetic fields from the media. By fundamental principles of magnetoresistance, three general kinds of magnetoresistive (MR) sensors have been developed: an AMR sensor that utilizes the anisotropic magnetoresistive effect, such as a soft adjacent layer (SAL) sensor; a GMR sensor or GMR spin valve that utilizes the giant magnetoresistive effect; and a TMR sensor that utilizes the tunneling magnetoresistive effect.

MR sensors can be categorized based upon the direction of flow of the current that is used to detect the change in resistance of the sensor. It is known for this sense current to be directed either generally along the plane of the sensor layers or generally perpendicular to the plane of the sensor layers. The former configuration may be known as a current-in-plane (CIP) sensor, and the latter configuration may be known as a current-perpendicular-to-plane (CPP) sensor. In CIP sensors, conductive leads for the sensor are disposed between a pair of magnetically soft shield layers, and separated from the shields by electrically insulating read gap layers that are typically greater than five hundred angstroms in thickness. CPP sensors are instead electrically connected between the shields, which may serve as leads for the sensor.

CIP spin valve sensors typically include two ferromagnetic layers that are separated from each other by a nonferromagnetic, electrically conductive spacer layer. One of the ferromagnetic layers has a magnetization that is fixed or pinned in one direction (so-called "pinned layer"), and the other ferromagnetic layer has a magnetization that is free to rotate in the presence of a magnetic field (so-called "free layer"). CPP spin-dependent tunneling sensors may also have a free layer separated from a pinned layer, but the spacer layer in this case may be formed of electrically insulating material such as alumina or aluminum-nitride, formed to a thickness that is small enough (e.g., less than ten angstroms) to allow measurable quantum mechanical tunneling.

For both of the above sensors, the magnetization direction of the free layer relative to the pinned layer affects the resistance of the sensor, so that the resistance of the sensor senses the magnetic field from the media. The resistance of the sensor can itself be measured via changes in either voltage or electrical current while the sensor is subjected to a bias current or a bias voltage, respectively. The magnetization of the pinned layer can be fixed by an adjoining antiferromagnetic layer via exchange coupling. Tantalum is a conventionally preferred seed layer material for a subsequently deposited antiferromagnetic layer, in part due to the ability of tantalum films to induce a strong (111) crystalline structure in the subsequently deposited sensor layers. Such a (111) crystalline structure in the sensor layers was conventionally believed to be important in obtaining high values for parameters of importance such as the magnetoresistance. Stated differently, a decrease in the (111) texture was generally correlated with a decrease in magnetoresistance. Despite the fabrication of sensors with strong (111) textures, a need still exists for improved magnetoresistance.

SUMMARY

A magnetic sensor is disclosed that is disposed between top and bottom magnetic shield layers, the sensor comprising: a nonferromagnetic layer disposed beneath the top shield layer; a magnetically soft layer disposed beneath the nonferromagnetic layer, the magnetically soft layer having a magnetization that rotates in response to an applied magnetic field; a ferromagnetic pinned layer disposed beneath the magnetically soft layer; an antiferromagnetic layer disposed beneath the ferromagnetic layer; and an aluminum-nitride layer disposed between the antiferromagnetic layer and the bottom shield layer.

DESCRIPTION OF THE PREFERRED EMBODIMENT

Figure 1:
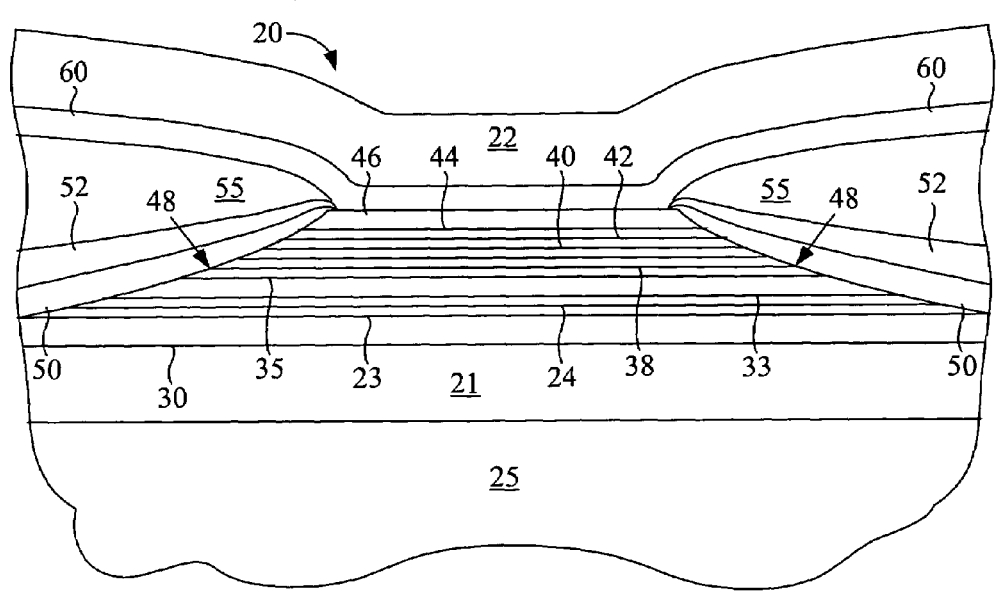
FIG. 1 is a cutaway, media-facing view of a magnetoresistive (MR) sensor according to a preferred exemplary embodiment of the present invention.

FIG. 1 is a cutaway, media-facing view of a magnetoresistive (MR) sensor according to a preferred exemplary embodiment of the present invention. The view in FIG. 1 is that which would be seen from a medium that faces the sensor, looking through any coating that might cover the sensor. Magnetoresistive (MR) sensor 20 disposed between a first magnetically soft shield layer 21 and a second magnetically soft shield layer 22. The sensor 20 has been formed on a major surface of a substrate 25 such as a silicon (Si), alumina ($Al_2O_3$) or alumina-titanium-carbide ($Al_2O_3TiC$) wafer. An inductive transducer, not shown in this figure, may have been formed above or below the sensor 20. The sensor 20 may have been formed on the wafer substrate 25 along with thousands of similar sensors, after which the substrate and attached sensors were divided into individual sensors, e.g., for magnetic heads.

In the embodiment of FIG. 1, atop the substrate 25, a first shield layer 21 of magnetically soft material such as permalloy (NiFe) has been formed to a thickness of about one micron. A number of thinner layers have been formed atop the first shield layer 21, beginning with a read gap layer 30 of electrically insulating, non-magnetic material such as alumina, formed in this example to a thickness of about twelve nanometers. Over the read gap layer 30 a plurality of seed layers have been formed, including an aluminum-nitride (AlN) layer 23 and a nickel-iron-chromium (NiFeCr) layer 24. The seed layers 23 and 24 form a seed layer structure for an antiferromagnetic (AF) layer 33, which may be formed for example of platinum-manganese (PtMn) to a thickness of about fourteen nanometers or greater. Alternative materials that may be used for AF layer 33 include platinum-palladium-manganese (PtPdMn), iridium-manganese (IrMn) and nickel-manganese (NiMn) or the like.

Employment of an AlN seed layer 23 instead of a conventional tantalum (Ta) seed layer has been found to increase the antiferromagnetic exchange coupling of AF layer 33, decrease current shunting through the seed layer, and/or provide more uniform crystalline growth in the AF layer 33, thereby increasing yield. The AlN seed layer 23 is preferably formed, for example by physical vapor deposition, to a thickness that is in a range between about five angstroms and about thirty angstroms for this embodiment, and can have a thickness up to about eighty angstroms for this example in which it is formed over a read gap layer such as alumina. The NiFeCr seed layer may have a thickness in a range between about twenty angstroms and about forty-five angstroms in this embodiment, and may alternatively be formed of related materials, such as nickel-chromium (NiCr).

AF layer 33 adjoins a first pinned ferromagnetic layer 35, which has a magnetization direction that is stabilized by the AF layer 33. In the embodiment of FIG. 1, the first pinned ferromagnetic layer 35 is separated from a second pinned ferromagnetic layer 40 by non-magnetic spacer layer 38 formed for example of ruthenium having thickness between about eight and ten angstroms, which couples the magnetizations of the first and second pinned layers in opposite directions. For example, the first pinned layer may have a magnetization that is directed toward the medium (out of the page in FIG. 1), and the second pinned layer may have a magnetization that is directed away from the medium (into of the page in FIG. 1). Each of the first and second pinned layers may be formed for example of cobalt-iron (CoFe) to a thickness between about fifteen and twenty-five angstroms. In the embodiment of FIG. 1, a non-magnetic, electrically conducting spacer layer 42, which may be formed for example of copper (Cu) to a thickness between about fifteen and twenty angstroms, separates the second pinned layer 40 from a magnetically soft layer 44. The magnetically soft layer 44 has a magnetization that can rotate due to an applied magnetic field having a strength that does not change the magnetization direction of either pinned layer 35 or pinned layer 40. The magnetically soft layer 44 is sometimes called a free layer, and may have a thickness between about twenty and thirty angstroms. A protective cap layer 46 has been formed to a thickness of between about twenty and fifty angstroms for example of tantalum, alumina or aluminum-nitride atop the free layer 44.

After these sensor layers have been deposited over the read gap layer 30 by physical vapor deposition (PVD) such as sputtering, a lift-off mask, not shown in FIG. 1, was patterned atop the sensor layers. The sensor layers were then milled, for example by rotating ion beam etching (IBE), to form lateral edges 48 of the sensor 20. The ion milling process terminates before milling much of the read gap layer 30 to create the shallow edges 48, so the read gap layer 30 can be made thinner than is conventional, for example twenty nanometers or less. This thinner read gap layer 30 in turn increases the resolution of the sensor 22, by decreasing the shield-to-shield spacing. Moreover, as illustrated with reference to the embodiment of FIG. 6, the read gap might then be made thin enough that it can also serve as an AlN seed layer. Combining the seed layer and read gap layer in a single AlN layer can further reduce the shield-to-shield spacing and further increase resolution. An additional benefit of the AlN seed layer 23 of the embodiment of FIG. 1 is a reduction in problems due to redeposition during ion milling. For example, milling of a tantalum seed layer may result in redposition of conductive "ears" at the edges of the liftoff mask that can lead to shorting of the sensor to the second shield. Since AlN is electrically insulating, redeposition of AlN from seed layer 23 does not cause shorting of the sensor to the second shield.

In the embodiment of FIG. 1, electrically conductive, non-magnetic underlayers 50 were then formed of chromium (Cr), tungsten (W) or another material(s) on the sensor edges 48. The underlayers 50 may each be formed of plural layers, for example amorphous layers including, for example, elements such as gallium or alloys such as nickel-niobium that provide isolation from the crystalline structure of the AF layer, followed by crystalline layers made of, for example, chromium or tungsten alloys that provide crystal lattices promoting in-plane magnetization of adjoining hard bias layers 52. Permanent magnet hard bias layers 52 were then formed on the underlayers 50 so that the bias layers are generally aligned with the free layer 44. Electrically conductive leads 55 were then formed out of gold (Au), copper (Cu), aluminum (Al) or other materials. A second read gap layer 60 was then formed of electrically insulating, non-magnetic material, followed by the second soft magnetic shield layer 22.

Figure 2:
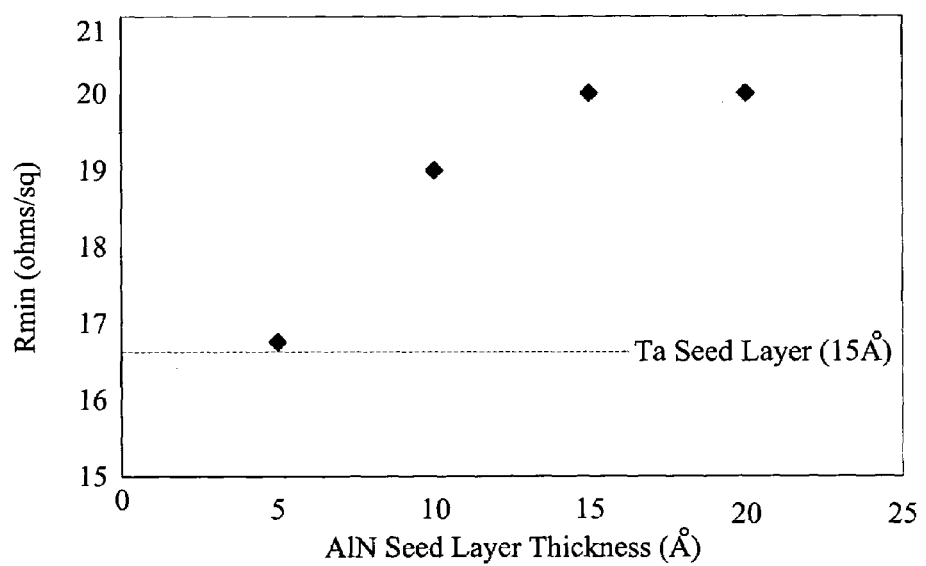
FIG. 2 is a plot of the minimum sheet resistance (Rmin) of the sensor layers versus the thickness of the alumina-nitride seed layer, for a sensor similar to that shown in FIG. 1.

As mentioned above, one advantage of employing an AlN seed layer 23 instead of the conventional Ta seed layer for AF layer 33 is a decrease in shunting of electrical current by the seed layer. In other words, use of the insulating AlN seed layer 23 causes a greater proportion of the sense current to flow through the free layer, spacer layer and pinned layer, increasing the sensitivity of the sensor. FIG. 2 is a plot of the minimum sheet resistance (Rmin) of the sensor layers versus the thickness of the alumina-nitride seed layer, for a sensor similar to that shown in FIG. 1. As a reference, Rmin for a sensor having conventional fifteen angstrom thick tantalum seed layer is shown. Even at a thickness a small as five angstroms, the AlN seed layer provides slightly greater resistance than the conventional fifteen angstrom thick tantalum seed layer. At a thickness equal to that of the conventional fifteen angstrom thick tantalum seed layer, the AlN seed layer provides significantly greater resistance.

Figure 3:
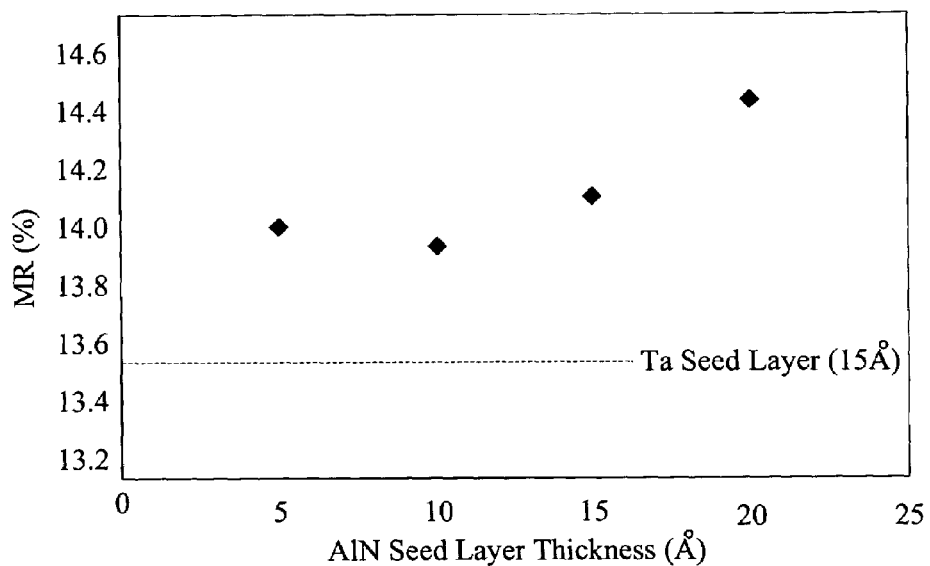
FIG. 3 is a plot of the magnetoresistance (MR) ratio of the sensor layers versus the thickness of the alumina-nitride seed layer, for a sensor similar to that shown in FIG. 1.

FIG. 3 is a plot of the magnetoresistance (MR) ratio of the sensor layers versus the thickness of the alumina-nitride seed layer, for a sensor similar to that shown in FIG. 1. The MR ratio, shown in FIG. 3 as a percentage, is defined as (Rmax−Rmin)/Rmin. As a reference, MR(%) for a sensor having a conventional fifteen angstrom thick tantalum seed layer is shown. Note that the MR ratio for the sensor with an AlN seed layer is greater than that for the tantalum seed layer at any AlN seed layer thickness for which MR was measured, and generally increases with AlN seed layer thickness from ten to twenty angstroms.

Figure 4:
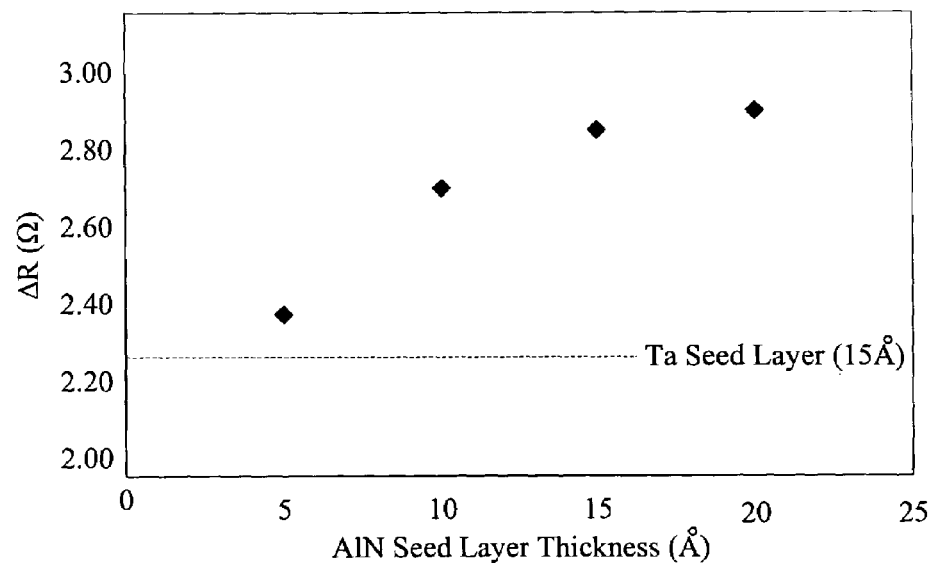
FIG. 4 is a plot of the electrical sheet resistance change (Rmax−Rmin) of the sensor layers versus the thickness of the alumina-nitride seed layer, for a sensor similar to that shown in FIG. 1.

FIG. 4 is a plot of the electrical sheet resistance change of the sensor layers versus the thickness of the alumina-nitride seed layer, for a sensor similar to that shown in FIG. 1. The resistance change, shown in FIG. 4 in ohms (Ω), is defined as ΔR=Rmax−Rmin. As a reference, ΔR for a sensor having a conventional fifteen angstrom thick tantalum seed layer is shown. Note that the resistance change ΔR for the sensor with an AlN seed layer is greater than that for the tantalum seed layer at any AlN seed layer thickness for which ΔR was measured, and generally increases with AlN seed layer thickness from five to twenty angstroms. This result runs contrary to the commonly held belief that the strong (111) texture provided by a Ta seed layer yields sensor layers of optimal quality and therefore optimal magnetoresistance. The enhanced magnetoresistance may result from specular reflection of electrons at the AlN interface while conserving their spin direction.

Figure 5:
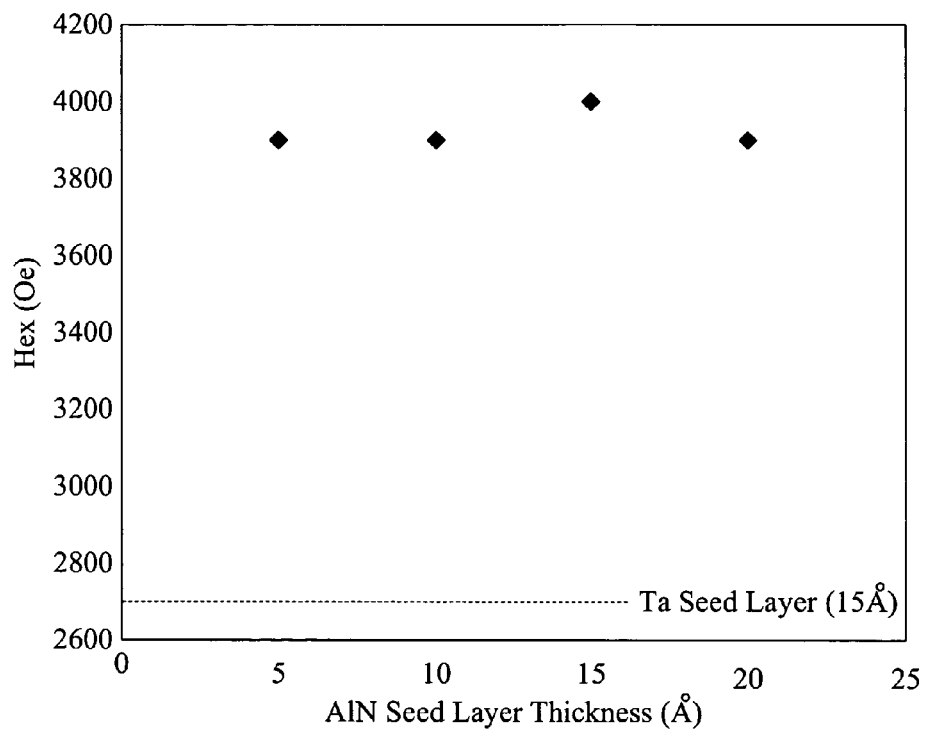
FIG. 5 is a plot of the strength of the exchange coupling field (Hex) that pins the magnetization of a pinned layer to an adjoining AF layer, for a sensor similar to that shown in FIG. 1.

FIG. 5 is a plot of the strength of the exchange coupling field (Hex) that pins the magnetization of a pinned layer to an adjoining AF layer, for a sensor similar to that shown in FIG. 1. The exchange coupling field strength (Hex), shown in FIG. 5 in oersted (Oe), is found by gradually increasing an applied magnetic field strength until the magnetization of the pinned layer flips. As a reference, Hex for a sensor having a conventional fifteen angstrom thick tantalum seed layer is shown. Note the appreciable increase in Hex for the sensor with an AlN seed layer of any thickness for which Hex was measured, demonstrating that a stronger pinning force is engendered by the AlN seed layer.

The AlN seed layer 23 of the exemplary embodiment of FIG. 1 can be crystalline, rather than amorphous like tantalum or alumina, producing a fine-grained structure in an AF layer grown above the AlN seed layer. For example, the AF layer 33 contains at least five crystal grains within a distance of sixty nanometers. The fine-grained structure is believed to provide an increase in uncompensated spins at the interface between the AF layer 33 and the first pinned layer 35, increasing the exchange coupling between layers 33 and 35. This, in turn, can increase the performance of the sensor. In addition to the above mentioned advantages of decreased sense current shunting, increased pinning strength, increased magnetoresistance, and reduced redeposition problems, employment of the AlN seed layers 23 provides increased uniformity of grain size, increasing the number of acceptable sensors per wafer, which may be called the yield.

Figure 6:
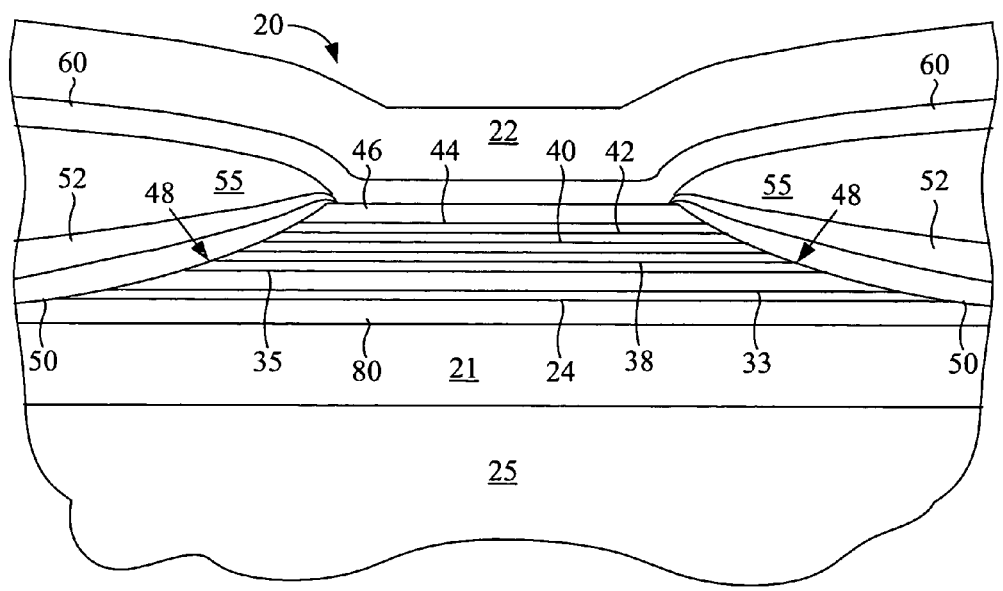
FIG. 6 is a cutaway, media-facing view of a magnetoresistive (MR) sensor according to another exemplary embodiment of the present invention.

FIG. 6 is a cutaway, media-facing view of a magnetoresistive (MR) sensor according to another exemplary embodiment of the present invention. The embodiment of FIG. 6 is similar to the embodiment of FIG. 1, except that in FIG. 6 a first read gap layer 80 is formed of AlN that also serves as a seed layer. Although it is difficult to form AlN to a sufficient thickness to provide a first read gap layer and also have the crystalline structure of the AlN suitable for a seed layer, such a combined AlN read gap/seed layer 80 is feasible for thicknesses between about and sixty angstroms and about one hundred and twenty angstroms. To achieve a desired fine-grained crystalline texture that increases the AF pinning field, a combined AlN read gap/seed layer 80 preferably has a thickness that is less than about one hundred angstroms.

The sensor 20 may have been formed on the wafer substrate 25 along with thousands of similar sensors, which may also be called read transducers. After formation of the layers shown in FIG. 6, an inductive transducer may be formed, after which the substrate and attached transducers were divided into individual transducers, e.g., for magnetic heads. The magnetic heads can each be mounted on a suspension that holds the head next to a medium such as a magnetic disk, for writing and reading bits in a disk drive.

The invention claimed is:

1. A magnetic sensor that is disposed between top and bottom magnetic shield layers, the sensor comprising:
   a nonferromagnetic layer disposed beneath the top shield layer;
   a magnetically soft layer disposed beneath the nonferromagnetic layer, the magnetically soft layer having a magnetization that rotates in response to an applied magnetic field;
   a ferromagnetic pinned layer disposed beneath the magnetically soft layer;
   an antiferromagnetic layer disposed beneath the ferromagnetic layer; and
   an aluminum-nitride layer disposed between the antiferromagnetic layer and the bottom shield layer.

2. The sensor of claim 1, wherein the aluminum-nitride layer has a thickness that is less than one hundred angstroms.

3. The sensor of claim 1, wherein the aluminum-nitride layer has a thickness that is in a range between five angstroms and thirty angstroms.

4. The sensor of claim 1, wherein the antiferromagnetic layer contains manganese.

5. The sensor of claim 1, wherein the antiferromagnetic layer contains a plurality of crystal grains.

6. The sensor of claim 1, further comprising a layer that contains chromium and is disposed between the aluminum-nitride layer and the antiferromagnetic layer.

7. The sensor of claim 6, wherein the layer containing chromium also contains a ferromagnetic element.

8. The sensor of claim 6, wherein the layer containing chromium also contains nickel.

9. The sensor of claim 1, wherein the aluminum-nitride layer is crystalline.

10. The sensor of claim 1, wherein the antiferromagnetic layer includes at least five crystal grains within a distance of sixty nanometers.

11. The sensor of claim 1, wherein the antiferromagnetic layer contains a metal selected from the group consisting of platinum, palladium, iridium and nickel.

12. A magnetic sensor that is disposed between top and bottom magnetic shield layers, the sensor comprising:
   a nonferromagnetic layer disposed beneath the top shield layer;
   a magnetically soft layer disposed beneath the nonferromagnetic layer, the magnetically soft layer having a magnetization that rotates in response to an applied magnetic field;
   a ferromagnetic pinned layer disposed beneath the magnetically soft layer;
   an antiferromagnetic layer disposed beneath the ferromagnetic layer, the antiferromagnetic layer containing manganese; and
   a seed layer structure disposed between the antiferromagnetic layer and the bottom shield layer, the seed layer structure including an aluminum-nitride layer and a layer containing chromium.

13. The sensor of claim 1, wherein the antiferromagnetic layer contains a plurality of crystal grains.

14. The sensor of claim 1, wherein the seed layer structure has a thickness that is less than one hundred angstroms.

15. The sensor of claim 1, wherein the aluminum-nitride layer has a thickness that is in a range between five angstroms and thirty angstroms.

16. The sensor of claim 1, wherein the layer containing chromium also contains a ferromagnetic element.

17. The sensor of claim 1, wherein the layer containing chromium also contains nickel.

18. The sensor of claim 1, wherein the antiferromagnetic layer contains a metal selected from the group consisting of platinum, palladium, iridium and nickel.

19. The sensor of claim 1, wherein the antiferromagnetic layer includes at least five crystal grains within a distance of sixty nanometers.

20. A magnetic sensor that is disposed between top and bottom magnetic shield layers, the sensor comprising:
   a nonferromagnetic layer disposed beneath the top shield layer;
   a magnetically soft layer disposed beneath the nonferromagnetic layer, the magnetically soft layer having a magnetization that rotates in response to an applied magnetic field;
   a ferromagnetic pinned layer disposed beneath the magnetically soft layer;
   an antiferromagnetic layer disposed beneath the ferromagnetic layer, the antiferromagnetic layer containing a plurality of crystal grains; and
   an aluminum-nitride layer disposed between the antiferromagnetic layer and the bottom shield layer, the aluminum-nitride layer having a thickness that is less than one hundred angstroms.

21. The sensor of claim 20, further comprising a layer that contains chromium and is disposed between the aluminum-nitride layer and the antiferromagnetic layer.

22. The sensor of claim 21, wherein the layer containing chromium also contains a ferromagnetic element.

23. The sensor of claim 21, wherein the layer containing chromium also contains nickel.

24. The sensor of claim 20, wherein the aluminum-nitride layer has a thickness in a range between five angstroms and thirty angstroms.

25. The sensor of claim 20, wherein the antiferromagnetic layer contains a metal selected from the group consisting of platinum, palladium, iridium and nickel.

26. The sensor of claim 20, wherein the antiferromagnetic layer contains at least five of the grains within a distance of sixty nanometers.

* * * * *